(12) United States Patent
Kronrod

(10) Patent No.: US 6,714,026 B2
(45) Date of Patent: *Mar. 30, 2004

(54) SYSTEM AND METHOD FOR MEASURING THE THICKNESS OR TEMPERATURE OF A CIRCUIT IN A PRINTED CIRCUIT BOARD

(75) Inventor: James M. Kronrod, Moraga, CA (US)

(73) Assignee: Broadcom Corporation, Irvine, CA (US)

( * ) Notice: Subject to any disclaimer, the term of this patent is extended or adjusted under 35 U.S.C. 154(b) by 86 days.

This patent is subject to a terminal disclaimer.

(21) Appl. No.: 10/083,293

(22) Filed: Feb. 27, 2002

(65) Prior Publication Data

US 2003/0001593 A1 Jan. 2, 2003

Related U.S. Application Data

(63) Continuation-in-part of application No. 09/892,850, filed on Jun. 28, 2001, now Pat. No. 6,635,879.

(51) Int. Cl.[7] ............................................. G01R 27/08
(52) U.S. Cl. ........................................ 324/699; 324/126
(58) Field of Search ................................ 324/126, 699, 324/601, 105, 102; 702/57, 60; 338/49

(56) References Cited

U.S. PATENT DOCUMENTS 4,186,339 A * 1/1980 Finger ........................ 324/142
4,713,607 A   12/1987 Pepper
5,095,274 A    3/1992 Brokaw
6,028,426 A *  2/2000 Cameron et al. ........... 324/126

FOREIGN PATENT DOCUMENTS

DE         198 38 974 A1    3/2000

OTHER PUBLICATIONS

"Using PCB as a Current Shunt", Electronics World and Wireless World, Reed Business Publishing, vol. 99, No. 1691, Oct. 1993, pp. 862–863.

* cited by examiner

Primary Examiner—N. Le
(74) Attorney, Agent, or Firm—Squire, Sanders & Dempsey L.L.P.

(57) ABSTRACT

System for measuring a thickness of a circuit component on a printed circuit board (PCB). The system includes a first circuit, a power plane, a power strip, a calibration strip, a temperature sensor, and a second circuit. The power plane is coupled to the first circuit. The power strip is for providing power to the power plane and is disposed in the PCB connected to the power plane. The power strip has at least two vias. The calibration strip has a predetermined width and is disposed in said PCB. The calibration strip has at least two vias for measuring a voltage drop. The temperature sensor is coupled to the calibration strip and configured to measuring a temperature of the calibration strip. The second circuit is coupled to the temperature sensor and configured to determine the thickness of the calibration strip based on at least the temperature of the calibration strip.

70 Claims, 11 Drawing Sheets

SYSTEM AND METHOD FOR MEASURING THE THICKNESS OR TEMPERATURE OF A CIRCUIT IN A PRINTED CIRCUIT BOARD

CROSS REFERENCES TO RELATED ART

This application is a Continuation-In-Part application of application Ser. No. 09/892,850 filed Jun. 28, 2001, now U.S. Pat. No. 6,635,879, which is hereby incorporated by reference.

BACKGROUND OF THE INVENTION

1. Field of the Invention

This invention relates to systems and methods for measuring power characteristics of an electric circuit. More particularly, this invention relates to on-board systems and methods for measure power characteristics of a circuit or sub-circuit on a Printed Circuit Board, and for measuring temperature and thickness of the circuit or sub-circuit.

2. Description of the Related Art

Printed Circuit Boards (PCBs) are well known. PCBs are a convenient and effective way to manufacture and implement both analog and digital electronics, often referred to as integrated circuits. Today, integrated circuits on PCBs are used in a multitude of applications, such as in computers, networking equipment, electronic appliances, stereos, etc.

In general, a PCB is manufactured to design specifications and lays out the electronic circuits for the associated application, such as the wiring for an integrated circuit. Then, after the PCB has been manufactured, the elements and various components of the integrated circuit are mounted onto the PCB at touch points, such as by soldering, etc.

As integrated circuits have become more and more complex, their related power consumption and distribution becomes more demanding. Accordingly, accurate testing of an integrated circuit's power needs is essential to the production of quality integrated circuits, and in turn, electrical and electronic equipment.

Often, analytical tools such as component modeling tools or simulation tools (e.g., SPICE®, etc.) are used by design engineers to help predict power consumption and distribution across an integrated circuit. However, many factors make the accurate prediction of the characteristics of an integrated circuit unreliable. For example, it is common for a PCB to be manufactured to tolerances of up to ±10%. Similarly, component tolerances may vary. Thus, the modeling of an integrated circuit may be used for design purposes, but might not accurately predict the actual power consumption and power distribution characteristics of an integrated circuit on a PCB, which could change with the varying tolerances. Accordingly, electronics manufacturers still must rely on conventional, laboratory type testing of integrated circuits manufactured on PCBs.

The physical testing of a integrated circuit on a PCB is not without its problems. For example, it is a common practice to test an integrated circuit by "breaking up" or isolating sections of a circuit or sub-circuit on the PCB. In order to isolate a circuit or sub-circuit, a component (e.g., an inductor, etc.) is usually removed and a power source is then spliced in, such as by a wire. Then, various voltage and current measurements may be made using conventional meters (e.g., voltage and current meters, oscilloscopes, etc.). However, as electronic components become smaller, physically isolating circuits on a PCB and accurately attaching scopes and meters to the circuit becomes more cumbersome, and is often impossible.

Ideally, to perform such testing, a precision measurement of the current feeding a circuit is necessary, which can be achieved by providing a precision current source in series with the circuit, or by adding a precision resistor in series with a voltage source to a circuit. For example, referring to prior art FIG. 1, shown is a simple block diagram of a circuit 100 on a PCB. The circuit 100 has a load 102 and a voltage source 104. The power plane or PCB has a trace resistance level which is represented by R2. A precision resistor R1 is placed in series with the power plane (R2), and a precision current can be measured feeding load 102, such as by using a current meter across the precision resistor R1. However, by placing a component in series with the load (circuit) 102, the reliability of the circuit is directly related to the reliability of the precision resistor R1. Accordingly, the reliability of the entire circuit may be reduced.

Adding components in series with the circuit itself could affect the inductances of the circuit and accordingly, affect overall performance. Moreover, precision resistors also have the problem that they often cannot handle high current.

Furthermore, many circuits on a PCB are powered and connected via embedded circuits. In the example described above, the power plane is most likely embedded in the PCB, and therefore, certain characteristics of the power plane, such as thickness, will not be known. These characteristics may vary from PCB to PCB due to manufacturing tolerances. It may be important to know certain characteristics of the power plane or other embedded circuits for on-board testing of circuits or for measuring power of a circuit on a PCB.

However, since these circuits are embedded, conventional methods of measuring their thickness or other characteristics might not succeed. For example, conventional surface thickness measuring devices cannot be contacted with a power plane which is embedded in a PCB.

In view of the aforementioned problems, there is a need for new and improved systems and methods for measuring the power of a circuit on a PCB that is accurate and non-intrusive, and for measuring other characteristics of embedded circuits in a PCB. Such systems and methods should limit the number of additional components added to the circuit being tested, and should allow testers better access to circuits or less cumbersome methods to make measurements.

SUMMARY OF THE INVENTION

The present invention provides a system for measuring a thickness of a circuit component on a printed circuit board (PCB) The system includes a first circuit, a power plane, a power strip, a calibration strip, a temperature sensor, and a second circuit. The power plane is coupled to the first circuit. The power strip is for providing power to the power plane and is disposed in said PCB connected to the power plane. The power strip has at least two vias. The calibration strip has a predetermined width and is disposed in the PCB. The calibration strip has at least two vias for measuring a voltage drop. The temperature sensor is coupled to the calibration strip and configured to measuring a temperature of the calibration strip. The second circuit is coupled to the temperature sensor and configured to determine the thickness of the calibration strip based on at least the temperature of the calibration strip.

According to another embodiment of the present invention, provided is a system for measuring a thickness of circuit components on a printed circuit board (PCB). the system includes a first circuit, a power plane, a power strip, a calibration strip, a temperature regulator, and a second circuit. The power plane is coupled the first circuit. The power strip is for providing power to the power plane disposed in the PCB connected to the power plane. The power strip has at least two vias. The calibration strip has a predetermined width and is disposed in the PCB,. The calibration strip has at least two vias for measuring a voltage drop. The temperature regulator is coupled to the PCB and configured to maintain the PCB at a set temperature. The second circuit is configured to determine the thickness of the calibration strip based on at least the set temperature of the calibration strip.

According to another embodiment of the present invention, provided is a method for determining a thickness of a power strip of a circuit on a printed circuit board (PCB). The method includes the steps following steps: disposing a circuit onto a PCB.; embedding a power strip having a first predetermined length and width into the PCB between a first power supply and the circuit during a manufacturing process; disposing a calibration strip having a second predetermined length and width into the PCB during the manufacturing process; providing a second power supply to the calibration strip and grounding the power strip to form a current flow through the power strip; measuring a first voltage across the power strip; measuring a second voltage across the calibration strip; determining a temperature of the PCB; and calculating a thickness of the power strip based on the first and second voltages, the temperature, the first predetermined length and width and the second predetermined length and width.

According to another embodiment of the present invention, provided is a method for determining a thickness of a component of a circuit on a printed circuit board (PCB). The method includes the following steps: disposing a circuit onto a PCB; embedding a power strip having a first predetermined length and width into the PCB between a first power supply during a manufacturing process; embedding a calibration strip having a second predetermined length and width into the PCB during the manufacturing process; providing a second power supply to the calibration strip and grounding the calibration strip so that a current flows through the calibration strip; regulating a temperature of the PCB to be a set temperature; measuring a first voltage across the power strip; measuring a second voltage across the calibration strip; and calculating the thickness of the power strip based on the first and second voltages, the set temperature, the first predetermined length and width and the second predetermined length and width.

According to another embodiment of the present invention, provided is a system for measuring a thickness of a circuit component on a printed circuit board (PCB). The system includes a first circuit means, a power plane means, a power strip means, a calibration strip means, a temperature sensor means, and a second circuit means. The power plane means is for providing power to the first circuit means. The power strip means is for providing power to the power plane means disposed in the PCB, the power strip means having at least two vias. The calibration strip means has a predetermined width and is disposed in the PCB. The calibration strip means has at least two vias for measuring a voltage drop. The temperature sensor means is for measuring a temperature of the calibration strip means. The second circuit means is for determining the thickness of the calibration strip means based on at least the temperature of the calibration strip means.

According to another embodiment of the present invention, provided is a system for measuring a thickness of circuit components on a printed circuit board (PCB). The system includes a first circuit means, a power plane means, a power strip means, a calibration strip means, a temperature regulator means, and a second circuit means. The power plane means is for providing power to the first circuit means. The power strip means is for providing power to the power plane means disposed in the PCB, the power strip means having at least two vias. The calibration strip means has a predetermined width and is disposed in the PCB. The calibration strip means has at least two vias for measuring a voltage drop. The temperature regulator means is for maintaining the PCB at a set temperature. The second circuit means is for determining the thickness of the calibration strip means based on at least the set temperature of the calibration strip means.

BRIEF DESCRIPTION OF THE DRAWINGS

For full understanding of the present invention, reference should be made to the accompanying drawings, wherein.

DESCRIPTION OF THE PREFERRED EMBODIMENTS

Figure 1:
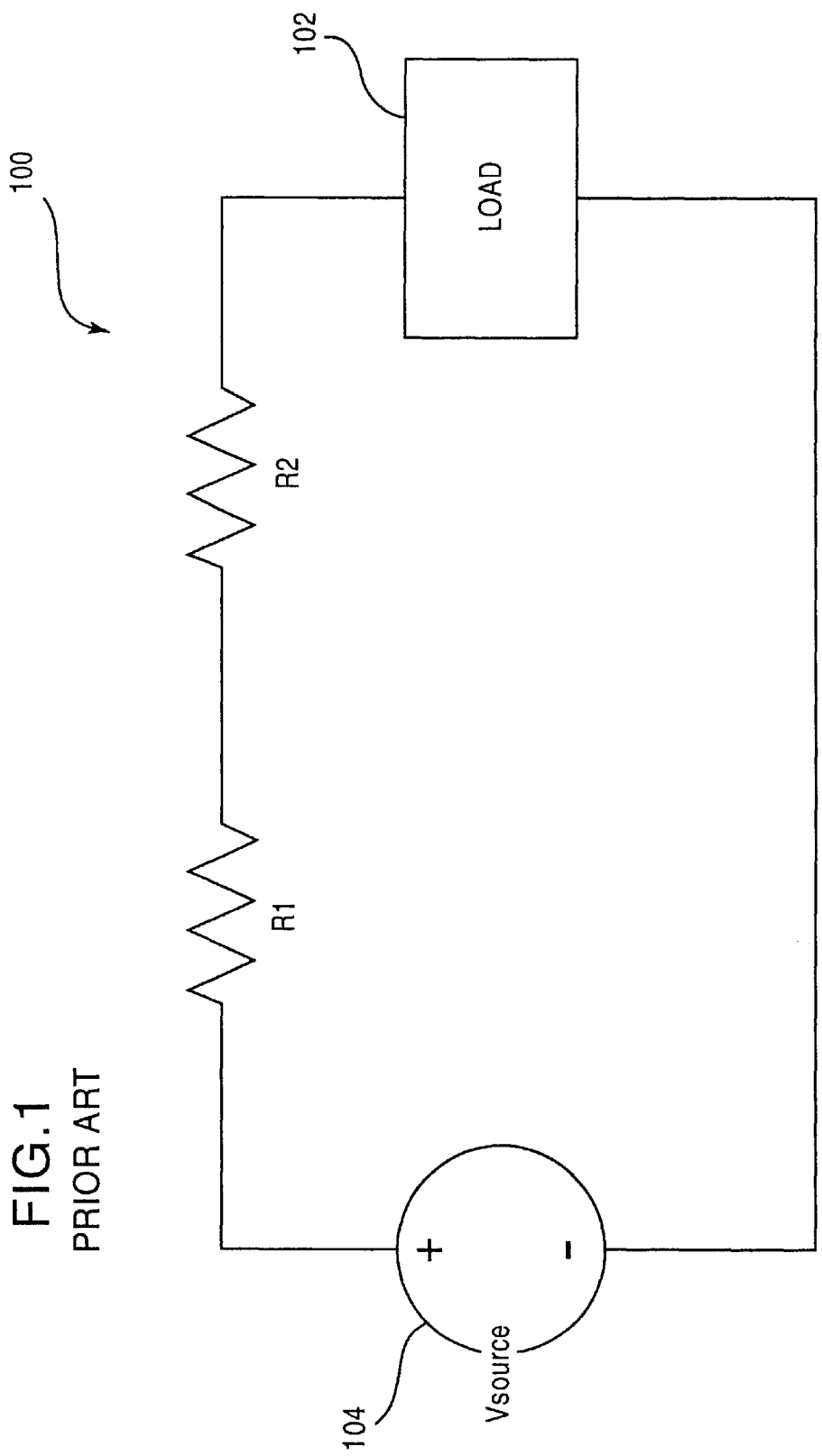
FIG. 1 is a schematic of a prior art system for measure power of a circuit on a PCB.
Figure 2:
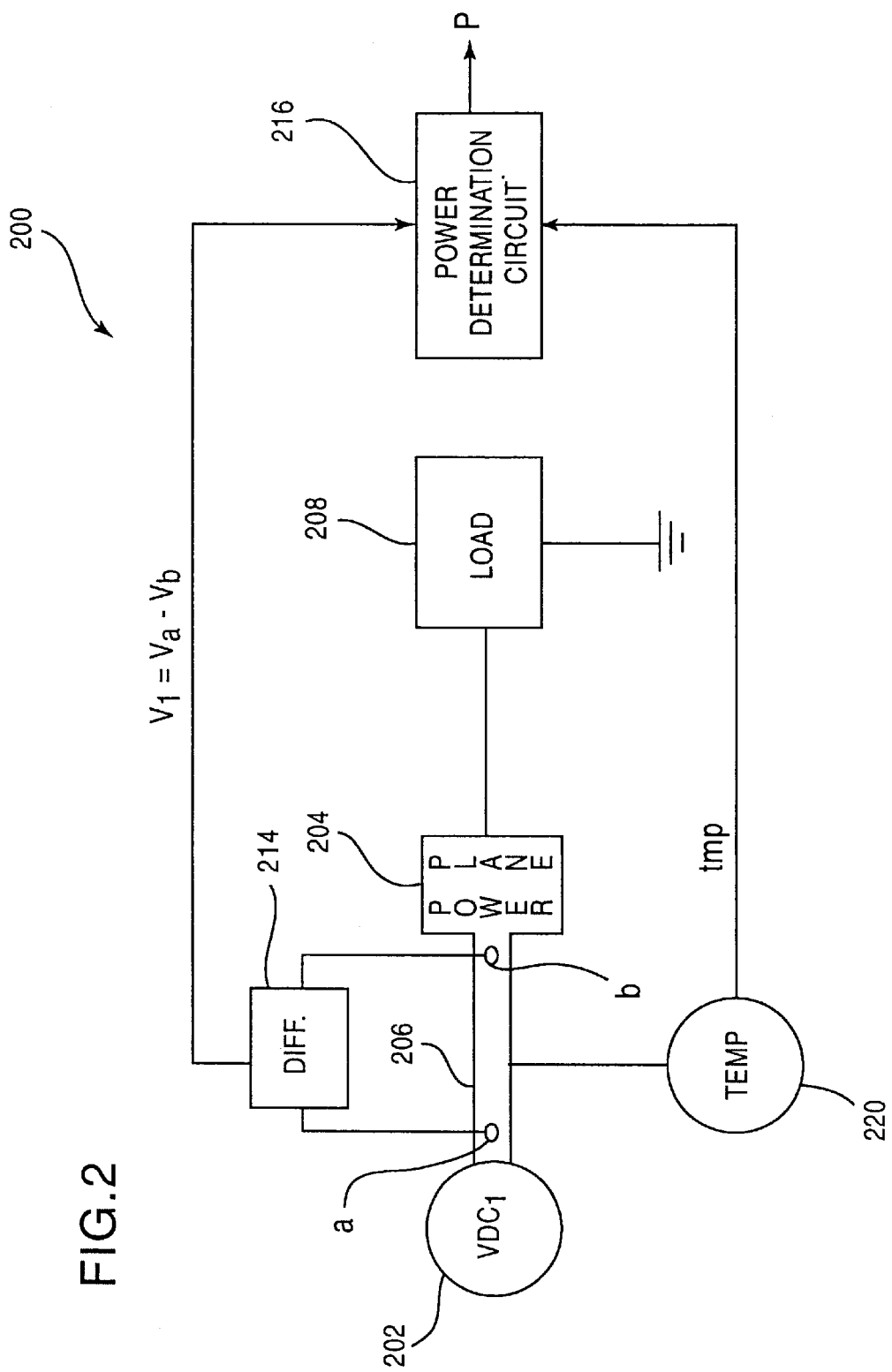
FIG. 2 is a block diagram of an on-board system for measure power of a circuit on a PCB according to a first embodiment of this invention.

Referring to FIG. 2, shown is an block diagram of a system for measuring the core power of a circuit on a printed circuit board (PCB) according to a first embodiment of the present invention. In particular, system 200 includes a power source 202 (VDC1), such as a DC voltage source, which supplies power to a power plane 204 via a power strip 206 (e.g., a wide copper strip). The power plane 204 is used to supply power to a circuit 208, which has a predetermined load.

The power strip 206 has vias a and b, voltage drop points, placed a predetermined distance apart. The voltage drop V1 across the vias a and b are input into a differencing circuit 214 which measure the voltage drop V1 and outputs a voltage signal equal to the voltage drop V1 to a power determination circuit 216. A temperature sensor 220 measures the temperature of the power strip 206 and outputs a temperature signal tmp to the power determination circuit 216. The power determination circuit 216 calculates the core power P of the circuit 208 and outputs a power signal P. As will be explained in detail below, various calculations may be made to determine the power based on a number of factors which could include voltage drop V1, the size of power strip 206, the material of each, the temperature tmp of the power strip 206, and the load of circuit 208. The power signal P can be output from power determination circuit 216 to a display circuit, calibrating circuit, or other circuit as desired.

Figure 3:
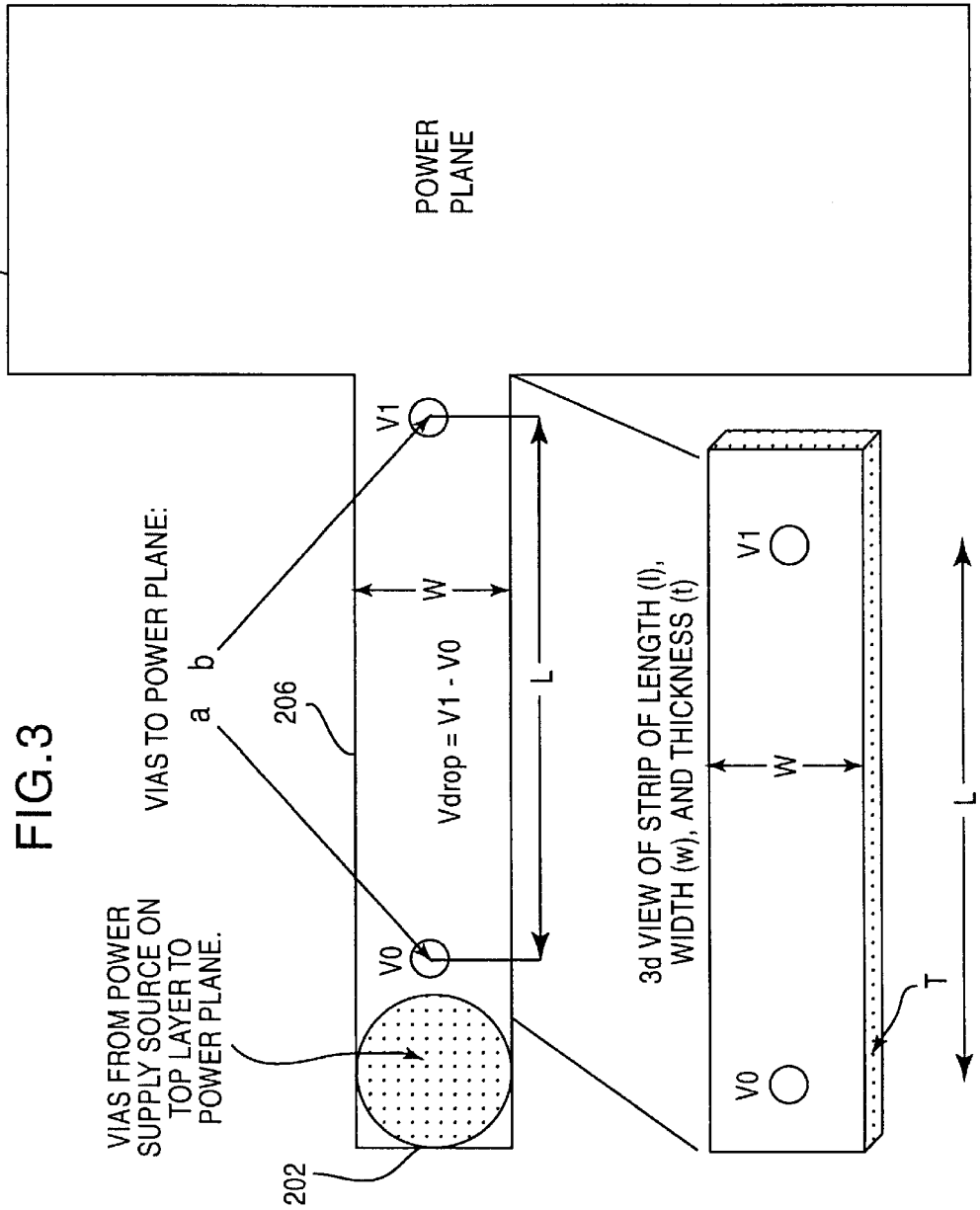
FIG. 3 is an expansion view of the power supply and power plane of the on-board system for measure power of a circuit on a PCB according to a first embodiment of this invention.

The various power calculations are described in more detail with reference to FIG. 3, which shows a close-up view of the power plane 204 and voltage source 202 connected by the power strip 206. Power strip 206 is shown having a length L, a width W and a thickness T. The material of the power strip can preferably be a good conductor, such as pure copper. According to a preferred embodiment, the power strip may be one ounce Cu with a thickness of 0.0012–0.0014 inches, but the present invention is not intended to be limited as such. The thickness T, resistivity of the material ($\rho$) and thermal coefficient of the material (e) are properties of the material used. The length L and width W may be controlled by design. The thickness T may be set at 0.001 inches as a default for the purposes of calculations.

In this embodiment of the present invention, the resistance R of the power strip 206 is calculated by taking into account the temperature (tmp) of the power strip 206, thermal coefficient (e), resistivity ($\rho$), the thickness T, and the known length L and width W. Accordingly, the following formulas may be used to calculate power:

$$R=(1+(tmp-20)*e)*L*\rho/W*T$$

$$P=VDC1*V1/R$$

Accordingly, the power determination circuit 216 may have the known values L, W, T, p and e stored in memory or input dynamically from an external source.

Since the thickness of the power strip 206 may be unknown or may vary depending on the manufacturing tolerances of the process used to manufacture the PCB, an on-board self calibrating circuit can be added to system 200 to eliminate the need for accurate measurement of the thickness, as described below in further detail. Furthermore, a system for measuring the thickness of the power strip 206 may be implemented on-board, and is also described in further detail below.

Figure 4:
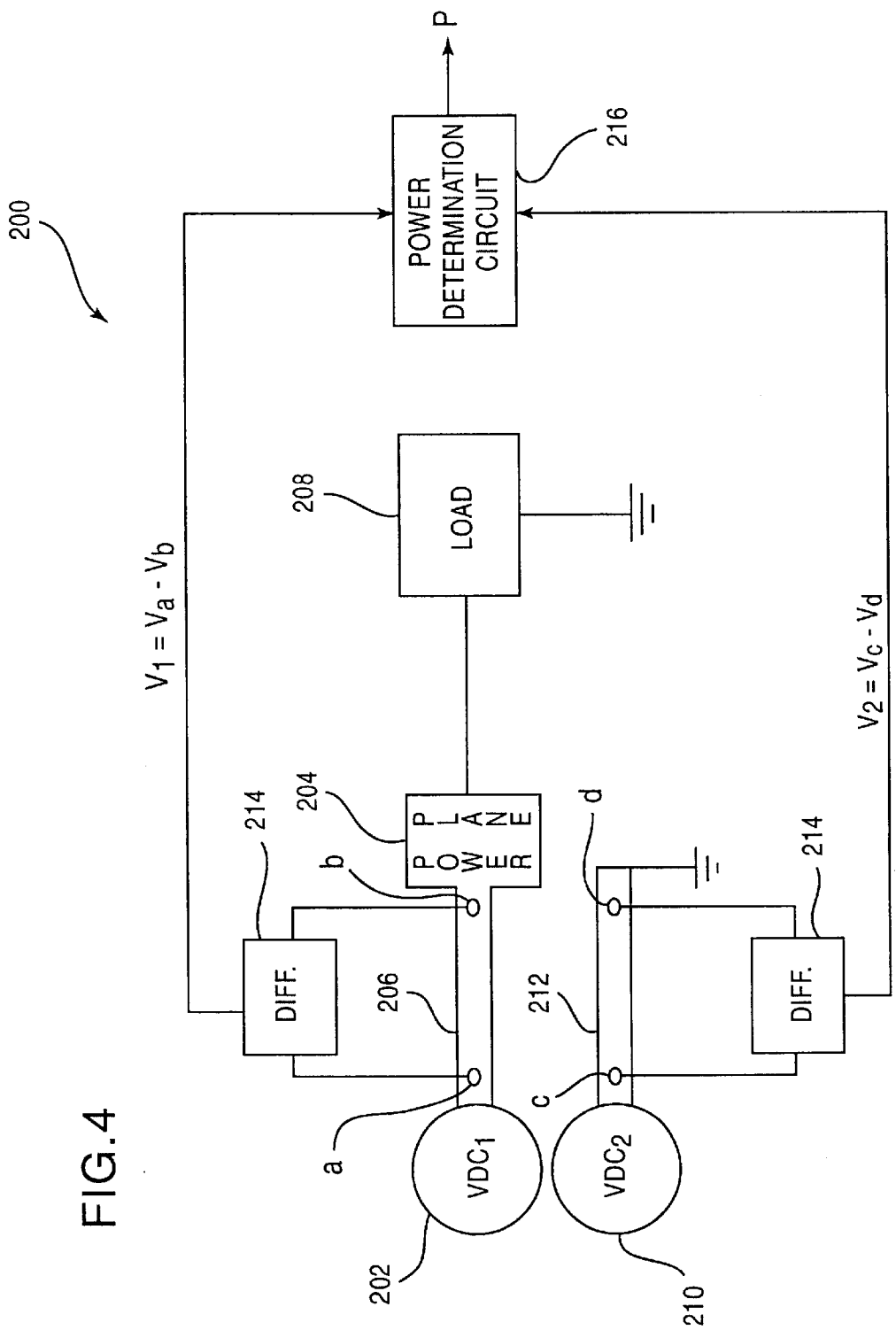
FIG. 4 is a block diagram of an on-board system for measure power of a circuit on a PCB and the thickness of a calibration strip embedded in the PCB according to a second embodiment of this invention.

Referring to FIG. 4, shown is an block diagram of a system for measuring the core power of a circuit on a printed circuit board and the thickness of a calibration strip embedded in the PCB according to a second embodiment of the present invention. In particular, system 200 includes a power source 202, such as a DC voltage source, which supplies power to a power plane 204 via a power strip 206. The power plane 204 is used to supply power to a circuit 208, which has a predetermined load. A second voltage supply 210 is connected to a calibration strip 212, which may be aligned in the same proximity as the power strip 206 on the PCB for reasons that will be explained below. The calibration strip 212 is directly grounded so that there is no loading of power source 210 other than the strip itself.

The power strip 206 and the calibration strip 212 have vias a–d, also referred to as voltage drop points, placed at a predetermined distance apart. The voltage drops V1 and V2 across the vias are input into difference circuits 214 which measure the voltage drop across each via. As an example, two differencing circuits are shown. The voltage drops measured, V1 and V2, are entered into a power determination circuit 216 which can calculate the core power of the circuit 208. As will be explained in detail below, various calculations may be made to determine the power based on a number of factors which could include V1 and V2, the dimensions of calibration strip 212 and power strip 206, the material characteristics of calibration strip 212 and power strip 206, the temperature of the calibration strip 212 and the power strip 206, and the load of circuit 208. Each of the dimensions and the material characteristics may be input into the power determination circuit 216 from an external source, such as a CPU or a memory device (not shown), or the power determination circuit 216 may be preprogrammed with these variables. The power can be output as a signal P from power determination circuit 216 to a display circuit, calibrating circuit, or other circuit as desired. Furthermore, the power determination circuit 216 may be configured to determine the resistance and the thickness of the power strip 206, if unknown.

As shown and described with reference to FIG. 3, the power P consumed by the load 208 can be calculated based on the voltage drop V1 across the power strip 206, the temperature (tmp) of the power strip 206, the thermal coefficient (e), resistivity (p), the thickness T, length L and width W. However, as explained above, the thickness T, thermal coefficient (e), and resistivity ($\rho$) may not always be controlled by design and may not be predicted with extreme accuracy because of varying manufacturing processes used to manufacture the PCB. Therefore, in this embodiment, the calibration strip 212 may be placed in a close proximity to the power strip 206 and may be made of the same material (e.g., copper or some other conductor or semi-conductor). Thus, regardless of the manufacturing process, the thickness T(cal) of the calibration strip 212 will be equal to or substantially equal to the thickness T(power) of the power strip 206. Also, since the calibration strip 212 is placed very close to the power strip 206, the temperature of calibration strip 212 on-board will be equal to or substantially equal to the temperature of the power strip 206 during operation. Accordingly, the need for accurate measurement of the temperature tmp or thickness T for power calculations can be eliminated, and the power calculations can be based on known and controlled, or easily measured variables.

Resistance can be determined in terms of the resistance of power strip 206 (R1) and calibration strip 212 (R2) as follows:

$$R1=(1+(tmp-20)*e)*L1*\rho(power)/W1*T(power)$$

$$R2=(1+(tmp-20)*e)*L2*\rho(cal)/W2*T(cal)$$

$$T(power)=T(cal)=T$$

$$\rho(power)=\rho(cal)=\rho$$

$$\rho=R2*W2*T/(1+(tmp-20)*e)*L2, \text{ therefore}$$

$$R1=L1*R2*W2/W1*L2$$

The resistance of the calibration strip 212 R2 may be determined by accurate measurement of the current through the strip, such as by adding a precision resistor in series with calibration strip 212 or by providing a precision current source (not shown). Thus, the power of the circuit 208 may be determined without intrusive meters or without adding additional components to the voltage path of the circuit 208.

It is possible to determine the thickness T of the power strip 206 or of the calibration strip 212, if the temperature tmp is known and, likewise, it is possible to determine temperature tmp if the thickness T is known. The thickness T of the calibration strip 212 may be determined by the following formula:

$$T=(L2*\rho)*(1+(tmp-20)*e)/(R2* W2)$$

Since R2 may already be determined as described above, the thickness of the power strip 206 may be determined by either measuring the temperature tmp or by setting the temperature tmp. For example, a temperature sensor 222 may be included in system 200 to measure the temperature tmp of the calibration strip 212 and input a signal tmp into power determination circuit 216.

Alternatively, a thermal regulating device, such as a fan or thermal stream (not shown), may be used to heat the entire PCB to a specific temperature before taking measurements. In this case, the power determination circuit 216 may be configured to pre-set the temperature tmp equal to the temperature of the board for calculation purposes. This temperature tmp may be used to then solve for the thickness T.

Also, if the thickness T is known or estimated, then the temperature tmp may be calculated by the following formula:

$$Tmp=((R2*W2*T)/(L2*\rho)-1)/(e+20)$$

Accordingly, the power determination circuit 216 may be configured to perform the preceding calculations. It is important to note that resistances and temperature each vary in accordance with one another, and in accordance with the amount of current within the material being measured. Therefore, calculations can be made instantaneously instead of over a period of time.

Figure 5A:
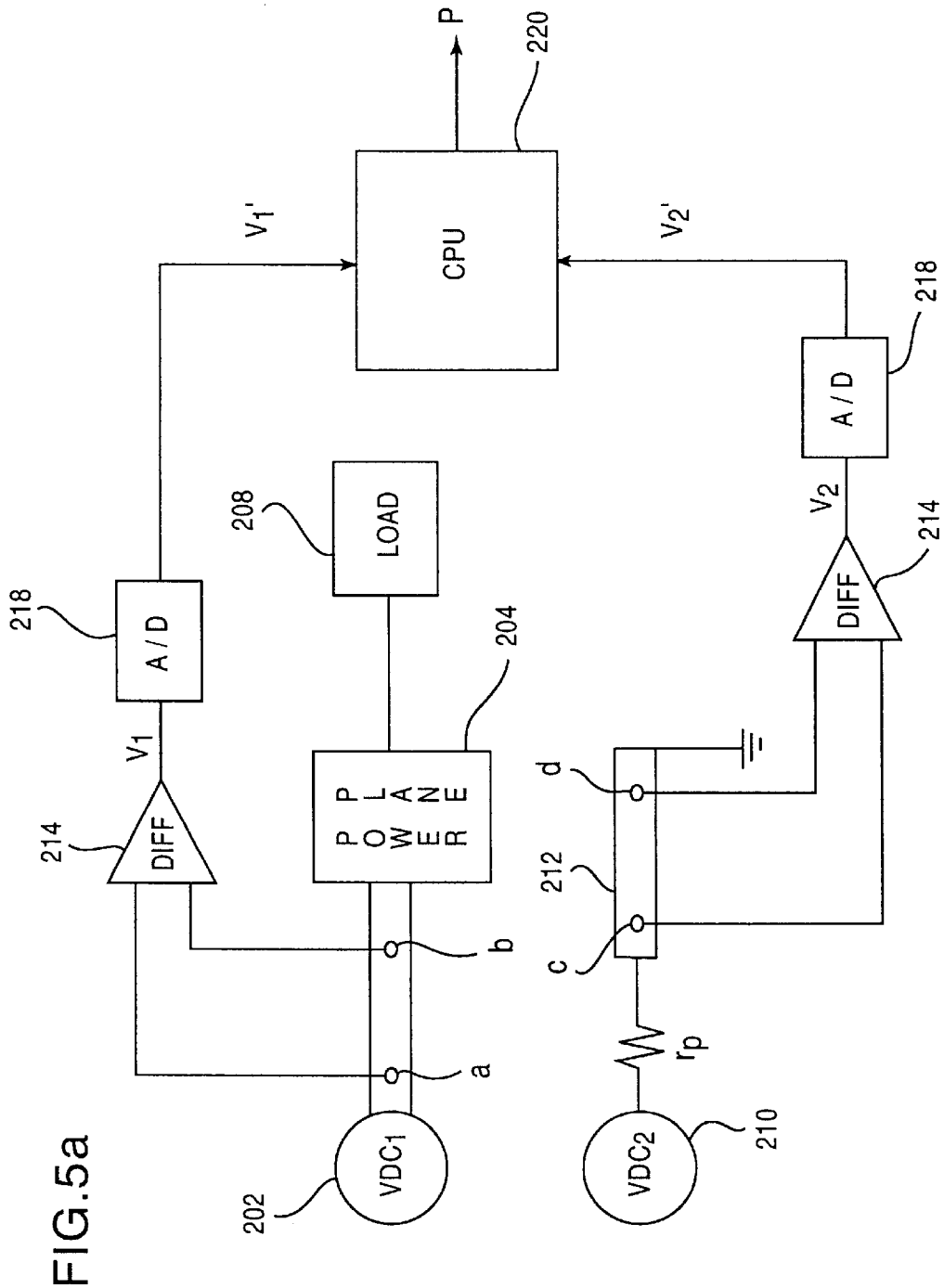
FIG. 5a is a schematic block diagram of an on-board system for measure power of a circuit on a PCB and the thickness of a calibration strip embedded in the PCB according to a first embodiment of this invention.

FIG. 5a is a block diagram of a system for measuring the core power of a circuit on a PCB and the thickness of a calibration strip embedded in the PCB according to a third embodiment of the present invention. This embodiment is similar to the second embodiment, but differs in that the power determination circuit 216 is replaced by an analog to digital (A/D) converter 218 and a CPU. Since the voltage drops V1 and V2 can be very small, a means for amplifying the voltage drops V2 and V2 may used. As an example, differencing circuits 214 may be operational amplifier circuits which feed an amplified voltage drops V1 and V2 to the A/D converters 218, which can accurately convert the amplified voltages V1 and V2 into digital signals V1' and V2', which are fed to the CPU 220. Temperature sensor 222 may input a signal directly into CPU 220, or in the case of an analog sensor, may input into another A/D converter (not shown) before inputting the temperature detected into the CPU 220. The CPU 220 can then calculate power P, the thickness T, or the temperature tmp using the calculations already described above.

In this embodiment, the temperature tmp may also be set for calculation purposes, and the board temperature may be regulated in accordance with the setting of the temperature tmp. A device, such as a heater or fan (not shown) may be used to regulate the temperature of the board. The board may be set to a predetermined temperature or may simply be regulated at a set temperature, which is then measured.

Although a CPU 220 is shown, the present invention is not meant to be limited to embodiments including a CPU. For example, one having ordinary skill in the art will understand that power calculations described herein may be performed using a variety of calculating means and methods, such as with digital and analog circuits.

Figure 5B:
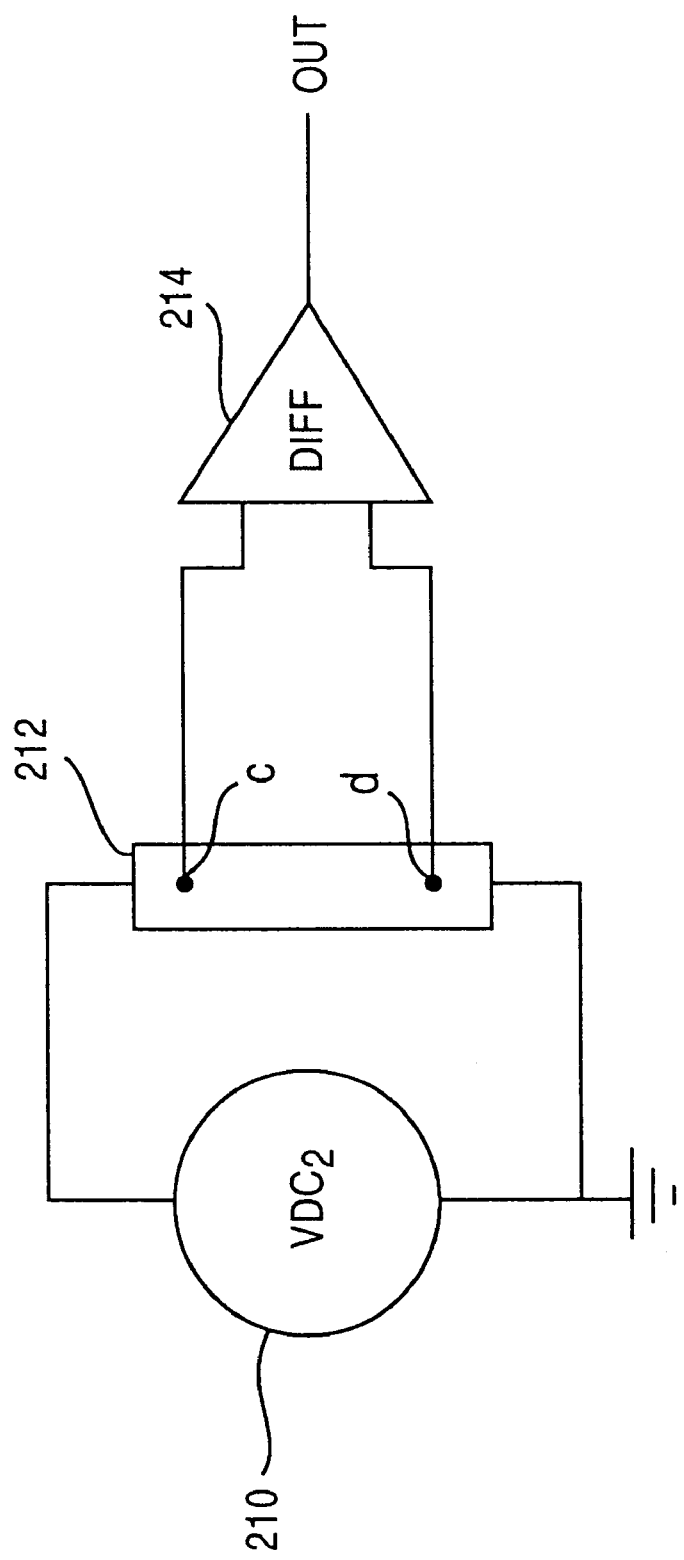
FIG. 5b is a schematic block diagram of an alternative power configuration for an on-board system for measure power of a circuit and the thickness of a calibration strip embedded in the PCB on a PCB.

FIG. 5b illustrates an alternate power configuration for the calibration strip 212. In particular, rather than providing a precision resistor in series with the current supply, the calibration strip 212 is placed directly in parallel with a voltage source 210, and the voltage drop V2 is measured by the differencing circuit 214 from vias c and d, in the same manner as described above. The output of the differencing circuit may be connected to A/D converter 218 as shown in FIG. 5a or to a power determination circuit as shown in FIG. 4.

Figure 6:
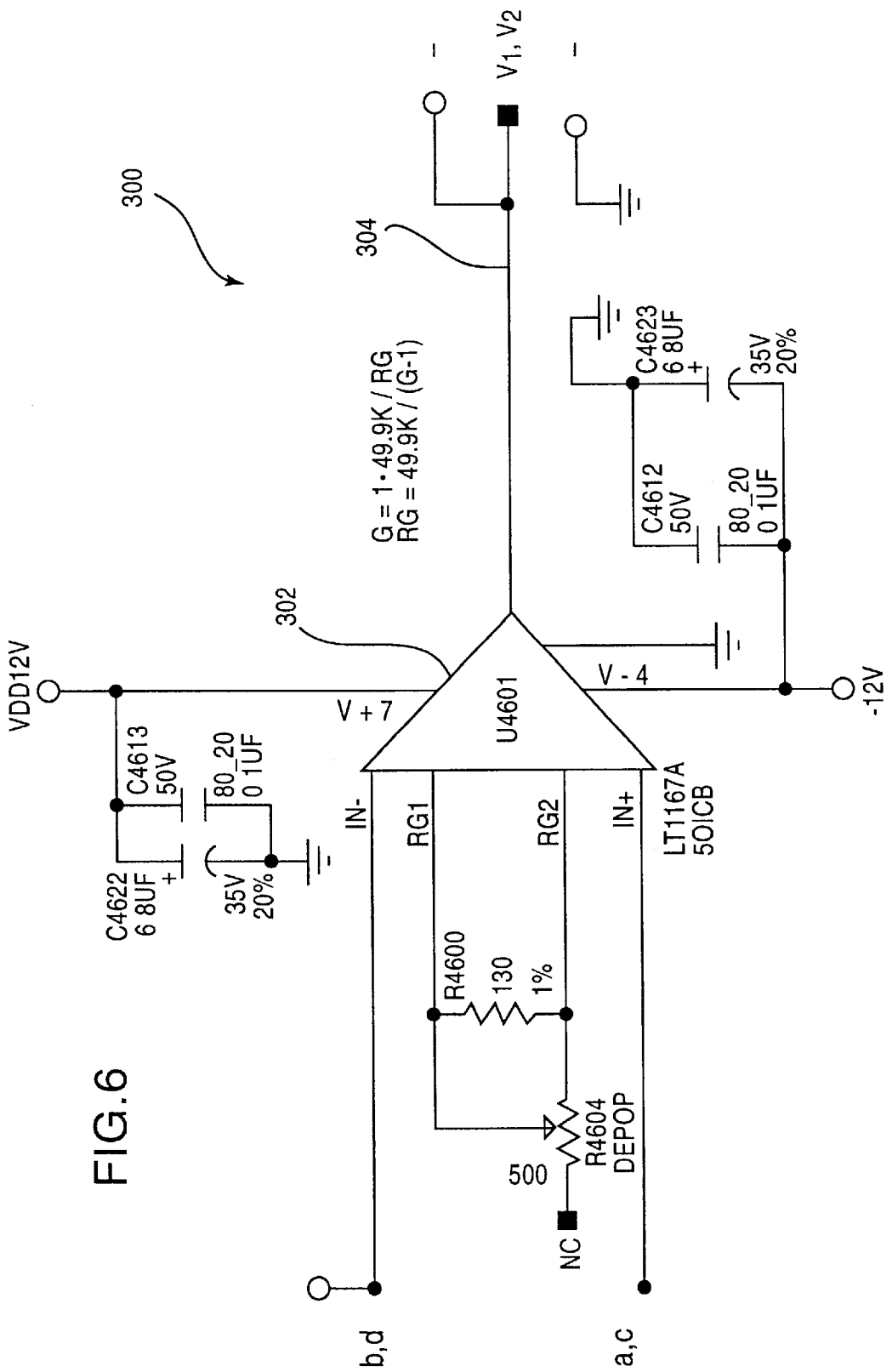
FIG. 6 is a schematic diagram of an on-board circuit for measuring power of a circuit on a PCB and the thickness of a calibration strip embedded in the PCB according to a second embodiment of this invention.

Referring to FIG. 6, an exemplary operational amplifier (e.g., an instrumentational op. amp.) circuit is shown which could be used as a differencing circuit 214. Circuit 300 includes an operational amplifier 302 having inputs IN+ and IN−, which can be connected to vias a or c, and b or d, respectively. One having ordinary skill in the art will readily understand the application of additional circuitry 306 in order to power, bias, and set the gain for an operational amplifier. Operational amplifier 302 has an amplified output 304 which can produce the signals V1 and V2.

The output 304 (e.g., V1 or V2) of operational amplifier 302 may be input into an A/D converter as shown in FIG. 5, a power calculation circuit as shown in FIG. 4, or may be conventionally measured, such as by a meter, oscilloscope or other suitable device. It will be understood by one having ordinary skill in the art that when measuring power across integrated circuits, measurements may be required to be amplified, such as by operational amplifiers or other means. However, the present invention is not meant to be limited as such, and it will be understood that an A/D converter may be provided that is accurate enough to measure such small voltages directly without amplification.

Figure 7:
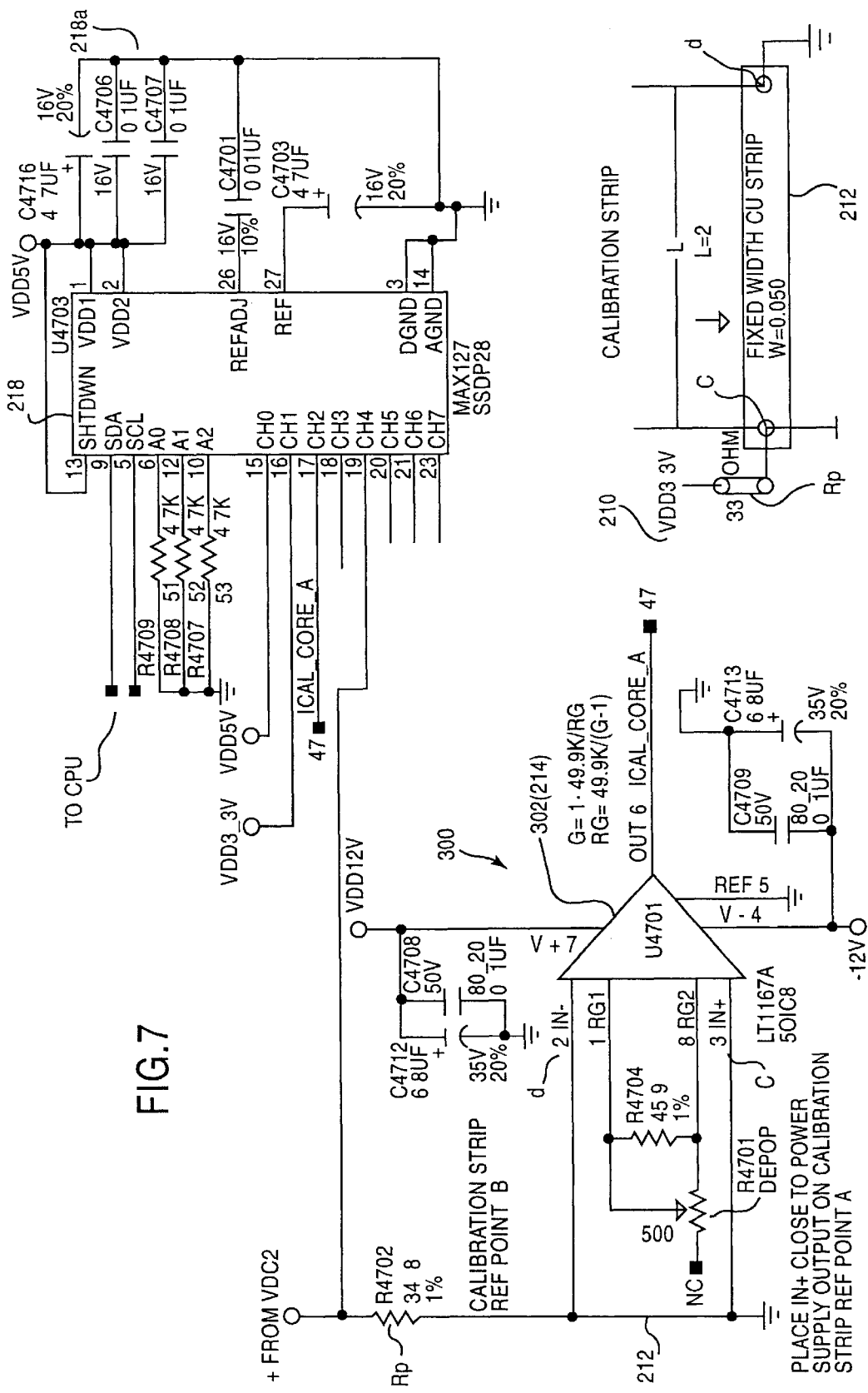
FIG. 7 is a schematic diagram of an on-board circuit for measuring power of a circuit on a PCB and the thickness of a calibration strip embedded in the PCB according to a second embodiment of this invention.

Referring now to FIG. 7, shown is a schematic diagram of an exemplary configuration of a differencing circuit 214 and A/D converter 218 used to deliver digital signals to CPU 220 or other processing means. In particular, an operational amplifier 302, similarly configured to the operational amplifier circuit 300 shown in FIG. 6, receives the voltages from vias c and d, or a and b, of the calibration strip 212.

The calibration strip 212 is placed in series with an input voltage source 210 and a precision resistor Rp, which is also shown in the expanded view of FIG.). The amplified output 47 (304) of the operational amplifier 310, which is the amplified potential V2 (or V1) across the vias of the calibration strip 212 (or power strip 206), is input into a channel of A/D converter 218. A/D converter 218 may be a 12 bit A/D converter with a scale of −0–5V DC, for example, but is not limited as such. The input voltage from voltage source 210 is also input into a channel of the A/D converter 218 as a reference voltage. The A/D converter 218 is powered and biased by circuit 218a. The A/D converter outputs corresponding digital signals (V2' and V reference) which may be input into CPU 220 or other calculation means in order to perform the power calculations. One having ordinary skill in the art will readily understand that the described configuration may be modified to include any number of amplifiers and A/D converters in order to accommodate circuits having more power strips and/or calibration strips.

Figure 8:
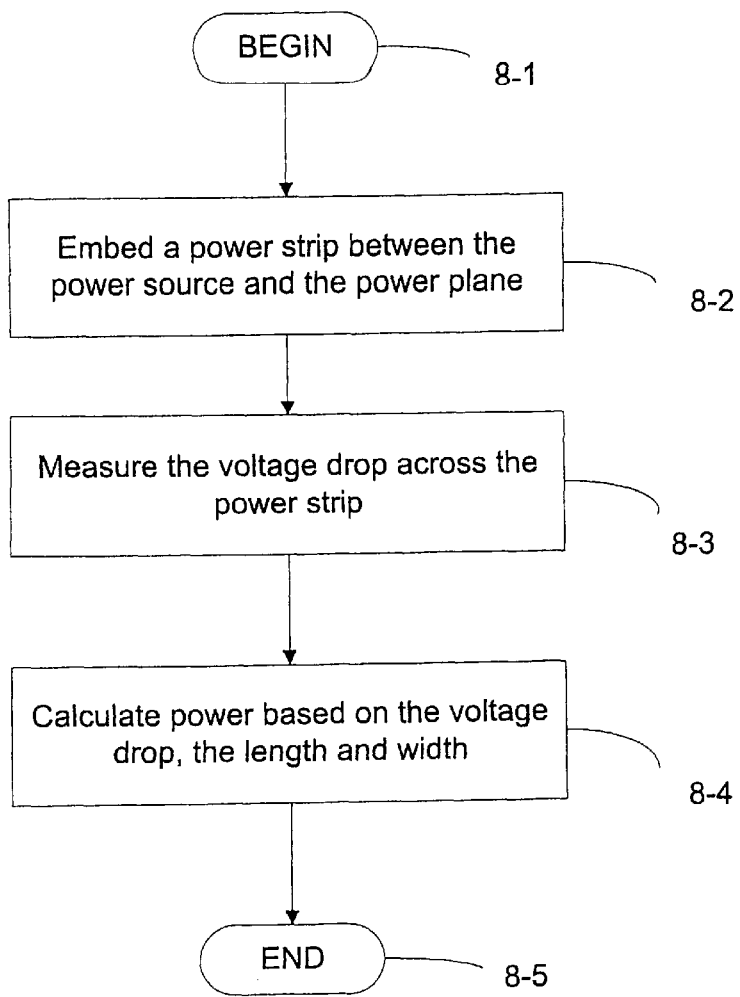
FIG. 8 is flow chart of a system for measuring the power of a circuit on a PCB according to a first embodiment of the present invention.

Referring to FIG. 8, shown is a flowchart of a method for measuring the power of a circuit on a PCB according to an embodiment of the present invention. Processing starts at step 8-1 and proceeds immediately to step 8-2. At step 8-2, a copper strip of known width, thickness and length and having vias, is placed between the voltage source and a power plane on a PCB during manufacturing of the PCB. Such a strip is shown and described above with reference to FIG. 3.

Next at step 8-3, the voltage drop across the power strip is measured, such as by a circuit connected to the strip at the vias. Such a circuit has already been described above with reference to FIGS. 2–7.

At step 8-4, once the voltage drop has been measured, the power can be calculated based on the length, width, thickness, voltage across the vias, temperature of the board, resistivity of the strip, and temperature coefficient of the strip. Such a circuit has already been described above and could include a differencing circuit, operational amplifiers, A/D converters, a power calculation circuit, and a CPU. Processing terminates at step 8-5.

Figure 9:
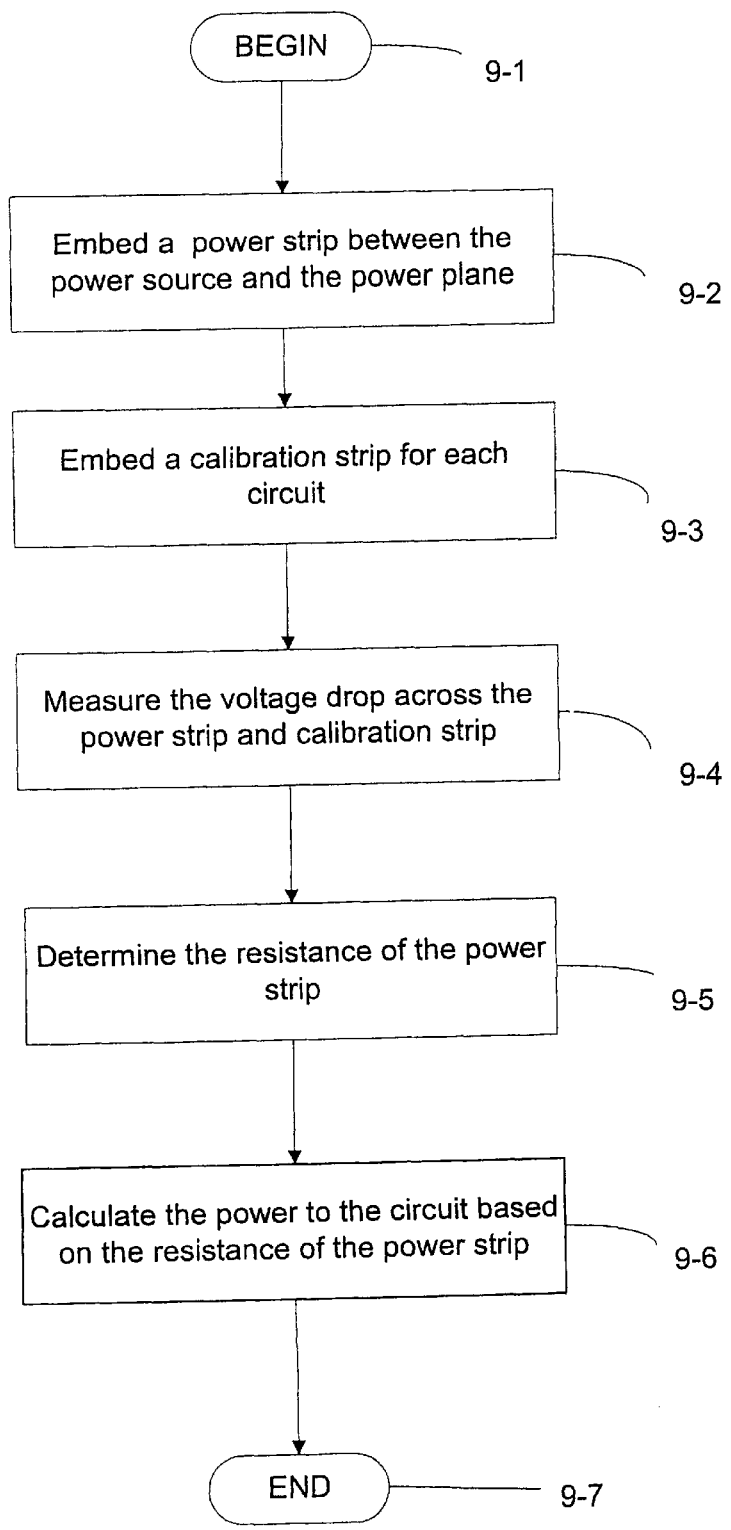
FIG. 9 is flow chart of a system for measuring the power of a circuit on a PCB according to a second embodiment of the present invention.

Referring to FIG. 9, shown is a flowchart of a method for measuring the power of a circuit on a PCB according to another embodiment of the present invention. Processing starts at step 9-1 and proceeds immediately to step 9-2. At step 9-2, a copper strip of known width and length and having vias, is disposed between the voltage source and a power plane feeding a circuit to have its power measured, on a PCB during manufacturing of the PCB; i.e., the power strip may be added during the circuit design process before manufacturing of the PCB. In this way, the strip is part of the PCB. Such a strip is shown and described above with reference to FIG. 3.

Next at step 9-3, a separate calibration strip is disposed in close proximity (e.g., adjacent) to the power strip. Similar to the previous step, the calibration strip can be preferably disposed during the manufacturing of the PCB. This calibration strip is given a power source having a known current, and can be the calibration strip already defined above with reference to FIGS. 4 and 5. Then at step 9-4, after manufacturing and during testing, a voltage drop V1 across the vias of the power strip and a voltage drop V2 across the vias of the calibration strip is measured. Measurement of the V1 and V2 can be done by conventional means or by the onboard circuitry described above with reference to FIGS. 2–7. Once V1 and V2 are known, the resistance of the power strip is determined at step 9-5, and from the resistance, the power of the circuit is calculated at step 9-6. The calculations can be performed via a CPU or a power determination circuit as shown and described with reference to FIGS. 2-7 above. Processing terminates at step 9-7.

Figure 10:
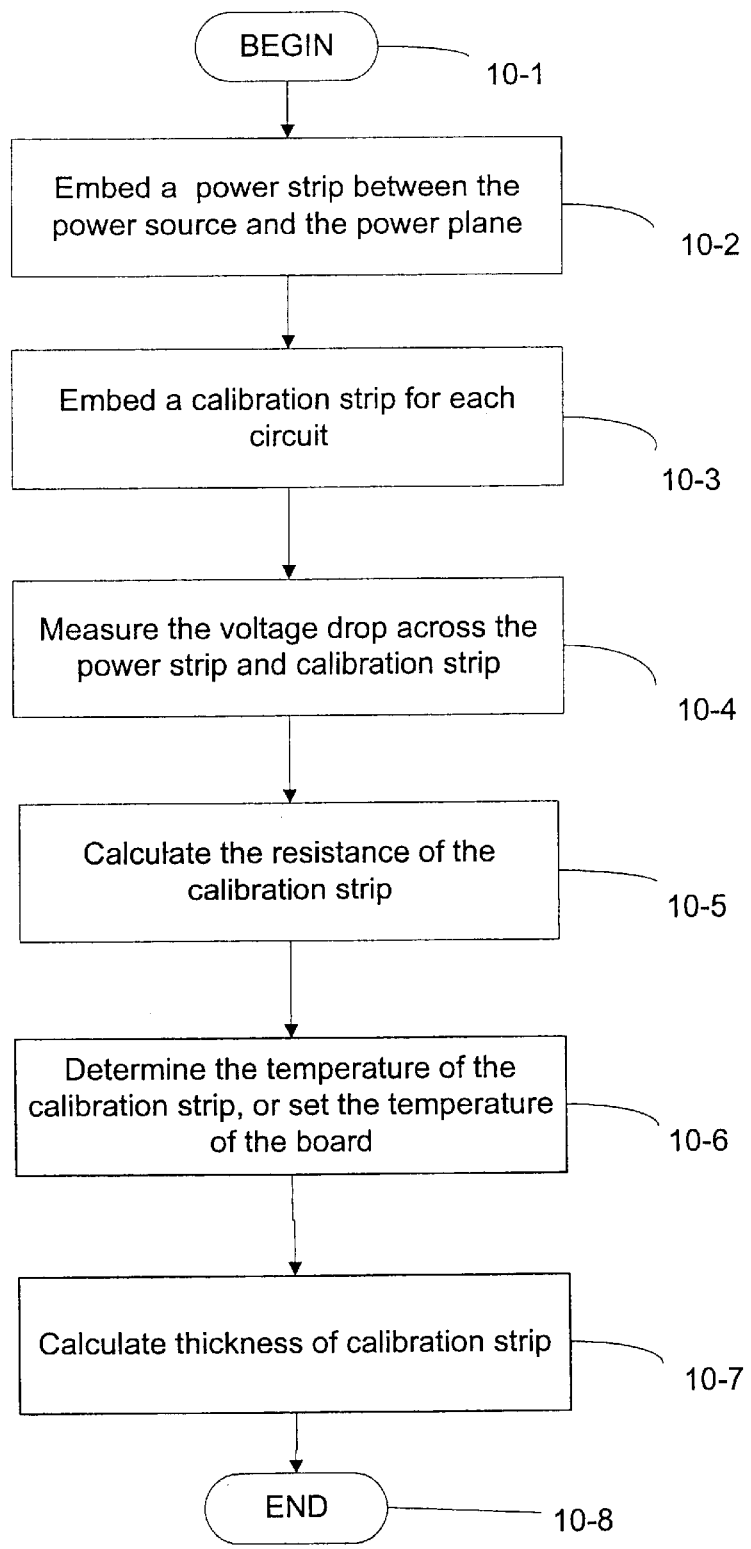
FIG. 10 is flow chart of a system for measuring the thickness or a power strip or a calibration strip embedded in a PCB according to an embodiment of the present invention.

Referring to FIG. 10, shown is a flowchart of a method for determining the thickness of a power strip of a circuit on a PCB according to another embodiment of the present invention. Processing starts at step 10-1 and proceeds immediately to step 10-2. At step 10-2, a copper strip (power strip) of known width and length and having vias, is disposed between the voltage source and a power plane feeding a circuit to have its power measured, on a PCB during manufacturing of the PCB; i.e., the power strip may be added during the circuit design process before manufacturing of the PCB instead of being placed upon the PCB after it is manufactured. In this way, the strip embedded into the PCB. Such a power strip is shown and described above with reference to FIG. 3.

Next at step 10-3, a separate calibration strip is disposed in close proximity (e.g., adjacent) to the power strip. Similar to the previous step, the calibration strip can be preferably disposed during the manufacturing of the PCB. This calibration strip is given a power source having a known current, and can be the calibration strip already defined above with reference to FIGS. 4 and 5. Then at step 10-4, after manufacturing and during testing, a voltage drop V1 across the vias of the power strip and a voltage drop V2 across the vias of the calibration strip is measured. Measurement of the V1 and V2 can be done by conventional methods or by the onboard circuitry described above with reference to FIGS. 2–7. Once V1 and V2 are known, the resistance of the calibration strip is determined at step 10-5.

At step 10-6, the temperature of the calibration strip is determined or set. As already described above, the temperature may be controlled via a device such as a heater, fan, or thermal stream, or may be measured using a sensor. Then, given the resistance of the calibration strip calculated at step 10-5, and the and the temperature determined or set at step 10-6, the thickness of the calibration strip is calculated at step 10-7. The calculation can be performed via a CPU or a power determination circuit as shown and described with reference to FIGS. 2–7 above. Processing terminates at step 10-7.

The thickness of the power strip may be assumed to be the same as the thickness of the calibration strip. Or alternatively, the resistance of the power strip may be calculated, and the thickness can then be calculated based on the temperature and the resistance of the power strip. As already described above, the thickness and temperature of the calibration strip should be an extremely accurate indicator of the temperature and thickness of the power strip.

Moreover, if the thickness of the calibration strip is known, then the temperature of the board or of the calibration can be calculated given the resistance and the thickness.

Thus, having fully described the invention by way of example with reference to the attached drawing figures, it will readily be appreciated that many changes and modifications may be made to the invention and to the embodiments disclosed without departing from the scope and spirit of the invention as defined by the appended claims. For example, the power strip and the calibration strip can be of any known conductor, semiconductor, or other suitable material. Also, if the temperature of an entire PCB at power is constant, then only one calibration strip is needed for making calculations for all circuits across the entire board (however, at least one power strip per circuit is still needed).

What is claimed is:

1. A system for measuring a thickness of a circuit component on a printed circuit board (PCB), said system comprising:
   a first circuit;
   a power plane coupled to said first circuit;
   a power strip for providing power to said power plane disposed in said PCB connected to said power plane, said power strip having at least two vias;
   a calibration strip having a predetermined width and being disposed in said PCB, said calibration strip having at least two vias for measuring a voltage drop;
   a temperature sensor coupled to said calibration strip and configured to measuring a temperature of said calibration strip; and
   a second circuit coupled to said temperature sensor and configured to determine the thickness of said calibration strip based on at least said temperature of said calibration strip.

2. The system according to claim 1, wherein said power strip and said calibration strip comprise a same type of material.

3. The system according to claim 2, wherein said power strip and said calibration strip comprise substantially copper.

4. The system according to claim 1, wherein said second circuit is configured to calculate said thickness of said calibration strip further based upon a first voltage across said at least two vias of said power strip and a second voltage across said at least two vias of said calibration strip.

5. The system of claim 4, wherein said second circuit is coupled to said power strip and two said calibration strip, and said second circuit is further configured to measure said first voltage and said second voltage.

6. The system of claim 5, wherein calibration strip and said power strip are each of a predetermined length, and said second circuit is configured to calculate said thickness of said calibration strip further based said predetermined lengths.

7. The system according to claim 5, wherein said power strip has a first predetermined length and width, and said calibration strip has a second predetermined length and width, and said second circuit is configured to calculate said thickness of said calibration strip further based upon said first predetermined length and width and said second predetermined length and width.

8. The system according to claim 5, wherein a first power supply is connected to said power strip and a second power supply is connected to said calibration strip, said second power supply comprising a precision current supply, and wherein said thickness is determined further based on a value of a current from said precision current supply.

9. The system according to claim 8, wherein said precision current supply comprises a precision resistor connected in series with said calibration strip.

10. The system according to claim 5, wherein said second circuit further comprises:
   a first operational amplifier configured to measure said first voltage;
   a second operational amplifier configured to measure said second voltage; and
   an analog to digital converter receiving said first and second voltages output from said first and second operational amplifiers respectively, and said temperature from said temperature sensor.

11. The system according to claim 5, wherein said second circuit further comprises:
   a differencing circuit configured to measure said first voltage and said second voltage and produce a first signal and a second signal corresponding to said first voltage and said second voltage respectively;
   a digital to analog converter configured to receive said first signal and said second signal from said differencing circuit and to convert said first signal and said second signal into a first digital signal and a second digital signal; and
   a calculation circuit configured to receive said first and second digital signals and perform said power calculation.

12. The system according to claim 11, wherein said calculation circuit comprises a computer processor.

13. The system according to claim 5, wherein said calibration strip is disposed in a same proximity of said power strip on said PCB.

14. A system for measuring a thickness of circuit components on a printed circuit board (PCB), said system comprising:
   a first circuit;
   a power plane coupled said first circuit;
   a power strip for providing power to said power plane disposed in said PCB connected to said power plane, said power strip having at least to vias;
   a calibration strip having a predetermined width and being disposed in said PCB, said calibration strip having at least two vias for measuring a voltage drop;
   a temperature regulator coupled to said PCB and configured to maintain said PCB at a set temperature; and
   a second circuit configured to determine the thickness of said calibration strip based on at least said set temperature of said calibration strip.

15. The system according to claim 14, wherein said power strip and said calibration strip comprise a same type of material.

16. The system according to claim 15, wherein said power strip and said calibration strip comprise substantially copper.

17. The system according to claim 16, wherein said second circuit is configured to calculate said thickness of said calibration strip further based upon a first voltage across said at least two vias of said power strip and a second voltage across said at least two vias of said calibration strip.

18. The system of claim 17, wherein said second circuit is coupled to said power strip and two said calibration strip, and said second circuit is further configured to measure said first voltage and said second voltage.

19. The system of claim 18, wherein calibration strip and said power strip are each of a predetermined length, and said second circuit is configured to calculate said thickness of said calibration strip further based said predetermined lengths.

20. The system according to claim 19, wherein said power strip has a first predetermined length and width, and said calibration strip has a second predetermined length and width, and said second circuit is configured to calculate said thickness of said calibration strip further based upon said first predetermined length and width and said second predetermined length and width.

21. The system according to claim 19, wherein a first power supply is connected to said power strip and a second power supply is connected to said calibration strip, said second power supply comprising a precision current supply, and wherein said thickness is determined further based on a value of a current from said precision current supply.

22. The system according to claim 21, wherein said precision current supply comprises a precision resistor connected in series with said calibration strip.

23. The system according to claim 19, wherein said second circuit further comprises:
   a first operational amplifier configured to measure said first voltage;
   a second operational amplifer configured to measure said second voltage; and
   an analog to digital converter receiving said first and second voltages output from said first and second operational amplifiers respectively, and said temperature from said temperature regulator.

24. The system according to claim 19, wherein said second circuit further comprises:
   a differencing circuit configured to measure said first voltage and said second voltage and produce a first signal and a second signal corresponding to said first voltage and said second voltage respectively;
   an analog to digital converter configured to receive said first signal and said second signal from said differencing circuit and to convert said first signal and said second signal into a first digital signal and a second digital signal; and a calculation circuit configured to receive said first and second digital signals and perform said power calculation.

25. The system according to claim 24, wherein said calculation circuit comprises a computer processor.

26. The system according to claim 19, wherein said calibration strip is disposed in a same proximity of said power strip on said PCB. 1.

27. The system according to claim 19, wherein said temperature regulator comprises a fan and a heating element.

28. The system according to claim 14, wherein said calibration strip is disposed in a same proximity of said power strip on said PCB.

29. The system according to claim 14, wherein said temperature regulator comprises a fan and a heating element.

30. A method for determining a thickness of a power strip of a circuit on a printed circuit board (PCB), said method comprising the steps of:

disposing a circuit onto a PCB;

embedding a power strip having a first predetermined length and width into said PCB between a first power supply and said circuit during a manufacturing process;

disposing a calibration strip having a second predetermined length and width into said PCB during the manufacturing process;

providing a second power supply to said calibration strip and grounding said power strip to form a current flow through said power strip;

measuring a first voltage across said power strip;

measuring a second voltage across said calibration strip;

determining a temperature of said PCB; and calculating a thickness of said power strip based on said first and second voltages, said temperature, said first predetermined length and width and said second predetermined length and width.

31. The method of claim 30 wherein the step of determining said temperature comprises measuring the temperature of said calibration strip; and wherein said step of calculating said thickness calculates said thickness further based on said temperature of said calibration strip.

32. The method of claim 30 wherein said calibration strip is placed in close proximity to said power strip during said embedding step.

33. The method of claim 30 further comprising the step of:
disposing a calibration circuit on said PCB configured to perform said measurement and said calculation steps.

34. The method of claim 33 wherein the step of calculating said thickness further comprises steps of:

measuring and amplifying said first voltage;

measuring and amplifying said second voltage; and converting said first and second voltages into first and second digital signals respectively.

35. The method of claim 34 wherein the step of disposing said calibration circuit further comprises the steps of:

disposing a differencing circuit on said PCB configured to measure said first voltage and said second voltage;

disposing an analog to digital converter on said PCB configured to convert said first voltage and said second voltage into a first digital signal and a second digital signal; and disposing a calculation circuit on said PCB configured to receive said first and second digital signals, and said temperature and perform said calculation.

36. A method for determining a thickness of a component of a circuit on a printed circuit board (PCB), said method comprising the steps of:

disposes a circuit onto a PCB;

embedding a power strip having a first predetermined length and width into said PCB between a first power supply during a manufacturing process;

embedding a calibration strip having a second predetermined length and width into said PCB during the manufacturing process;

providing a second power supply to said calibration strip and grounding said calibration strip so that a current flows through said calibration strip;

regulating a temperature of said PCB to be a set temperature;

measuring a first voltage across said power strip;

measuring a second voltage across said calibration strip; and calculating said thickness of said power strip based on said first and second voltages, said set temperature, said first predetermined length and width and said second predetermined length and width.

37. The method of claim 36 wherein said step of regulating the temperature of said board comprises a step of heating said board.

38. The method of claim 37 wherein said calibration strip is placed in close proximity to said power strip during said embedding step.

39. The method of claim 36 further comprising the step of:
disposing a calibration circuit on said PCB configured to perform said measurement and said calculation steps.

40. The method of claim 39 wherein the step of calculating said thickness further comprises steps of:

measuring and amplifying said first voltage;

measuring and amplifying said second voltage; and converting said first and second voltages into first and second digital signals respectively.

41. The method of claim 40 wherein the step of disposing a calibration circuit further comprises steps of:

disposing a differencing circuit on said PCB configured to measure said first voltage and said second voltage;

disposing an analog to digital converter on said PCB configured to convert said first voltage and said second voltage into a first digital signal and a second digital signal; and disposing a calculation circuit on said PCB configured to receive said first and second digital signals, perform said calculation based on said first and second digital signals and said set temperature.

42. A system for measuring a thickness of a circuit component on a printed circuit board (PCB), said system comprising:

a first circuit means;

a power plane means for providing power to said first circuit means;

a power strip means for providing power to said power plane means disposed in said PCB, said power strip means having at least two vias;

a calibration strip means having a predetermined width and being disposed in said PCB, said calibration strip means having at least two vias for measuring a voltage drop;

a temperature sensor means for measuring a temperature of said calibration strip means; and a second circuit means for determining the thickness of said calibration strip means based on at least said temperature of said calibration strip means.

43. The system according to claim 42, wherein said power strip means and said calibration strip means comprise a same type of material.

44. The system according to claim 43, wherein said power strip means and said calibration strip means comprise substantially copper.

45. The system according to claim 42, wherein said second circuit means is configured to calculate said thickness of said calibration strip means further based upon a first voltage across said at least two vias of said power strip means and a second voltage across said at least two vias of said calibration strip means.

46. The system of claim 45, wherein said second circuit means is further configured to measure said first voltage and said second voltage.

47. The system of claim 46, wherein calibration strip means and said power strip means are each of a predetermined length, and said second circuit means is configured to calculate said thickness of said calibration strip means further based said predetermined lengths.

48. The system according to claim 46, wherein said power strip means has a first predetermined length and width, and said calibration strip means has a second predetermined length and width, and said second circuit means is configured to calculate said thickness of said calibration strip means further based upon said first predetermined length and width and said second predetermined length and width.

49. The system according to claim 46 further comprising:

a first power supply means for supplying power to said power strip means; and a second power supply means for supplying a precision current supply to said calibration strip means;

wherein said thickness is determined further based on a value of a current from said second power supply means.

50. The system according to claim 49, wherein said second power supply means comprises a precision resistor means connected in series with said calibration strip means.

51. The system according to claim 46, wherein said second circuit means further comprises:

a first operational amplifier means for measuring said first voltage;

a second operational amplifier means for measuring said second voltage; and an analog to digital converter means for receiving said first and second voltages output from said first and second operational amplifiers means respectively, and said temperature from said temperature sensor means.

52. The system according to claim 46, wherein said second circuit means further comprises:

a differencing circuit means for measuring said first voltage and said second voltage and producing a first signal and a second signal corresponding to said first voltage and said second voltage respectively;

an analog to digital converter means for converting said first signal and said second signal into a first digital signal and a second digital signal; and a calculation circuit means for receiving said first and second digital signals and performing said power calculation.

53. The system according to claim 52, wherein said calculation circuit means comprises a computer processor means.

54. The system according to claim 46, wherein said calibration strip means is disposed in a same proximity of said power strip means on said PCB.

55. A system for measuring a thickness of circuit components on a printed circuit board (PCB), said system comprising:

a first circuit means;

a power plane means for providing power to said first circuit means;

a power strip means for providing power to said power plane means disposed in said PCB, said power strip means having at least two vias;

a calibration strip means having a predetermined width and being disposed in said PCB, said calibration strip means having at least two vias for measuring a voltage drop;

a temperature regulator means for maintaining said PCB at a set temperature; and a second circuit means for determining the thickness of said calibration strip means based on at least said set temperature of said calibration strip means.

56. The system according to claim 55, wherein said power strip means and said calibration strip means comprise a same type of material.

57. The system according to claim 55, wherein said power strip means and said calibration strip means comprise substantially copper.

58. The system according to claim 57, wherein said second circuit means is configured to calculate said thickness of said calibration strip means further based upon a first voltage across said at least two vias of said power strip means and a second voltage across said at least two vias of said calibration strip means.

59. The system of claim 58, wherein said second circuit means is further configured to measure said first voltage and said second voltage.

60. The system of claim 59, wherein calibration strip and said power strip means are each of a predetermined length, and said second circuit means is configured to calculate said thickness of said calibration strip means further based said predetermined lengths.

61. The system according to claim 60, wherein said power strip means has a first predetermined length and width, and said calibration strip means has a second predetermined length and width, and said second circuit means is configured to calculate said thickness of said calibration strip means further based upon said first predetermined length and width and said second predetermined length and width.

62. The system according to claim 60, further comprising:

a first power supply means for supplying power to said power strip means; and a second power supply means for supply a precision current supply to said calibration strip means;

wherein said thickness is determined further based on a value of a current from said second power supply means.

63. The system according to claim 62, wherein said pr second power supply means comprises a precision resistor means connected in series with said calibration strip means.

64. The system according to claim 60, wherein said second circuit further comprises:
- a first operational amplifier means for measuring said first voltage;
- a second operational amplifier means for measuring said second voltage; and
- an analog to digital converter means for receiving said first and second voltages output from said first and second operational amplifier means respectively, and said set temperature.

65. The system according to claim 60, wherein said second circuit further comprises:
- a differencing circuit means for measuring said first voltage and said second voltage and producing a first signal and a second signal corresponding to said first voltage and said second voltage respectively;
- an analog to digital converter means for receiving said first signal and said second signal from said differencing circuit and converting said first signal and said second signal into a first digital signal and a second digital signal; and
- a calculation circuit means for receiving said first and second digital signals and performing said power calculation.

66. The system according to claim 65, wherein said calculation circuit means comprises a computer processor means.

67. The system according to claim 60, wherein said calibration strip means is disposed in a same proximity of said power strip means on said PCB.

68. The system according to claim 60, wherein said temperature regulator means comprises a fan and a heating element.

69. The system according to claim 55, wherein said calibration strip means is disposed in a same proximity of said power strip means on said PCB.

70. The system according to claim 55, wherein said temperature regulator means comprises a fan and a heating element.

* * * * *